(12) United States Patent
Ito et al.

(10) Patent No.: US 6,703,650 B2
(45) Date of Patent: Mar. 9, 2004

(54) SEMICONDUCTOR INTEGRATED CIRCUIT INCLUDING A CIRCUIT PROTECTING AGAINST STATIC ELECTRICITY

(75) Inventors: Satoshi Ito, Suwa (JP); Hiroshi Seki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/885,003

(22) Filed: Jun. 21, 2001

(65) Prior Publication Data

US 2002/0014638 A1 Feb. 7, 2002

(30) Foreign Application Priority Data

Jun. 29, 2000 (JP) .......................... 2000-196484

(51) Int. Cl.⁷ ............................ H01L 27/10; H01L 23/62
(52) U.S. Cl. ...................................................... 257/203
(58) Field of Search ................................. 257/202–207, 257/355; 438/128–129

(56) References Cited

U.S. PATENT DOCUMENTS

6,060,752 A * 5/2000 Williams ...................... 257/355
6,339,234 B1 * 1/2002 Takizawa ..................... 257/203

FOREIGN PATENT DOCUMENTS

| JP | 62-224043 | 10/1987 |
| JP | 04-061371 | 2/1992 |
| JP | 06-224372 | 8/1994 |

* cited by examiner

Primary Examiner—Cuong Quang Nguyen
(74) Attorney, Agent, or Firm—Oliff & Berrdge, PLC

(57) ABSTRACT

When static electricity having an excessive voltage is applied to a $V_{SS}$ terminal, the static electricity may be transmitted to an inner cell directly connected to a $V_{SS}$ cell before the static electricity is discharged to the outside via an electrostatic protection circuit, possibly resulting in electrostatic destruction. Bypasses are thus provided to bypass the static electricity applied to a $V_{SS}$ terminal to a higher wiring layer, which allow only excessive static electricity to be selectively discharged to the outside via an electrostatic protection circuit.

4 Claims, 5 Drawing Sheets

SEMICONDUCTOR INTEGRATED CIRCUIT INCLUDING A CIRCUIT PROTECTING AGAINST STATIC ELECTRICITY

BACKGROUND OF THE INVENTION

1. Field of Invention

The present invention relates to a semiconductor integrated circuit, such as a gate array or an embedded array, and more specifically, it relates to a semiconductor integrated circuit having a circuit which protects against static electricity.

2. Description of Related Art

A semiconductor integrated circuit, such as a gate array or an embedded array, often incorporates power supply cells in input/output cell areas. FIG. 5 is a schematic view of a conventional semiconductor integrated circuit which includes such input/output cell areas. As shown in FIG. 5, a $V_{DD}$ cell incorporating a $V_{DD}$ terminal to which a high-potential supply voltage $V_{DD}$ is applied, and a $V_{SS}$ cell incorporating a $V_{SS}$ terminal to which a low-potential supply voltage $V_{SS}$ is applied, are arranged as power supply cells. Conventionally, the $V_{SS}$ cell is connected such that the power supply is directly transmitted from the $V_{SS}$ terminal to an inner cell area (PATH 1). The $V_{DD}$ cell has an electrostatic protection circuit (diode) formed between the $V_{DD}$ and the $V_{SS}$, so that when static electricity is applied to a power supply terminal, the static electricity may be discharged to the outside via the electrostatic protection circuit (PATH 2).

The reason that this electrostatic protection circuit is provided is described hereinbelow. For example, static electricity, which is charged on a living body, has a positive charge, and when static electricity having a positive charge is applied to the $V_{SS}$ terminal as the living body touches the semiconductor integrated circuit, a reverse voltage is generated between the $V_{DD}$ terminal and the $V_{SS}$ terminal, possibly resulting in damage to transistors in the inner cell. Thus, the electrostatic protection circuit described above is often provided in a typical power supply cell.

However, when static electricity having an excessive voltage is applied to the $V_{SS}$ terminal, the static electricity is transmitted to the inner cell directly connected to the $V_{SS}$ terminal before the static electricity is discharged to the outside via the electrostatic protection circuit. This may cause electrostatic destruction of the inner cell.

SUMMARY OF THE INVENTION

Accordingly, in view of the foregoing points, it is an object of the present invention to provide a semiconductor integrated circuit in which, even if excessive static electricity is applied to a $V_{SS}$ cell, the static electricity is discharged to the outside via an electrostatic protection circuit before the static electricity is transmitted to an inner cell to prevent electrostatic destruction of the inner cell.

In order to solve the above problems, a semiconductor integrated circuit according to the present invention includes a plurality of input/output cells including a high-potential power supply cell incorporating a high-potential power supply terminal, and a low-potential power supply cell incorporating a low-potential power supply terminal. A first lower wiring layer has a plurality of wires connected to the high-potential power supply terminal and the low-potential power supply terminal. At least one higher wiring layer is formed over the lower wiring layer across an insulating interlayer, and is electrically connected to the lower wiring layer via a hole provided in the insulating interlayer. A protection diode has a cathode and an anode electrically connected to the high-potential power supply terminal and the low-potential power supply terminal, respectively, via at least the lower wiring layer. An inner cell is electrically connected to the high-potential power supply terminal and the low-potential power supply via both the lower wiring layer and the higher wiring layer.

Furthermore, the inner cell may be electrically connected to the low-potential power supply terminal via a lower wiring layer located on the low-potential power supply cell, the higher wiring layer, and a lower wiring layer located on an input/output cell other than the low-potential power supply cell.

According to the present invention, the current from a $V_{SS}$ terminal is bypassed once to a higher wiring layer, so that even if static electricity having an excessive voltage is applied to a $V_{SS}$ cell, the static electricity can be discharged to the outside via an electrostatic protection circuit before the static electricity is transmitted to an inner cell, which prevents electrostatic destruction of the inner cell.

DETAILED DESCRIPTION OF THE PREFERRED EMBODIMENTS

Figure 1:
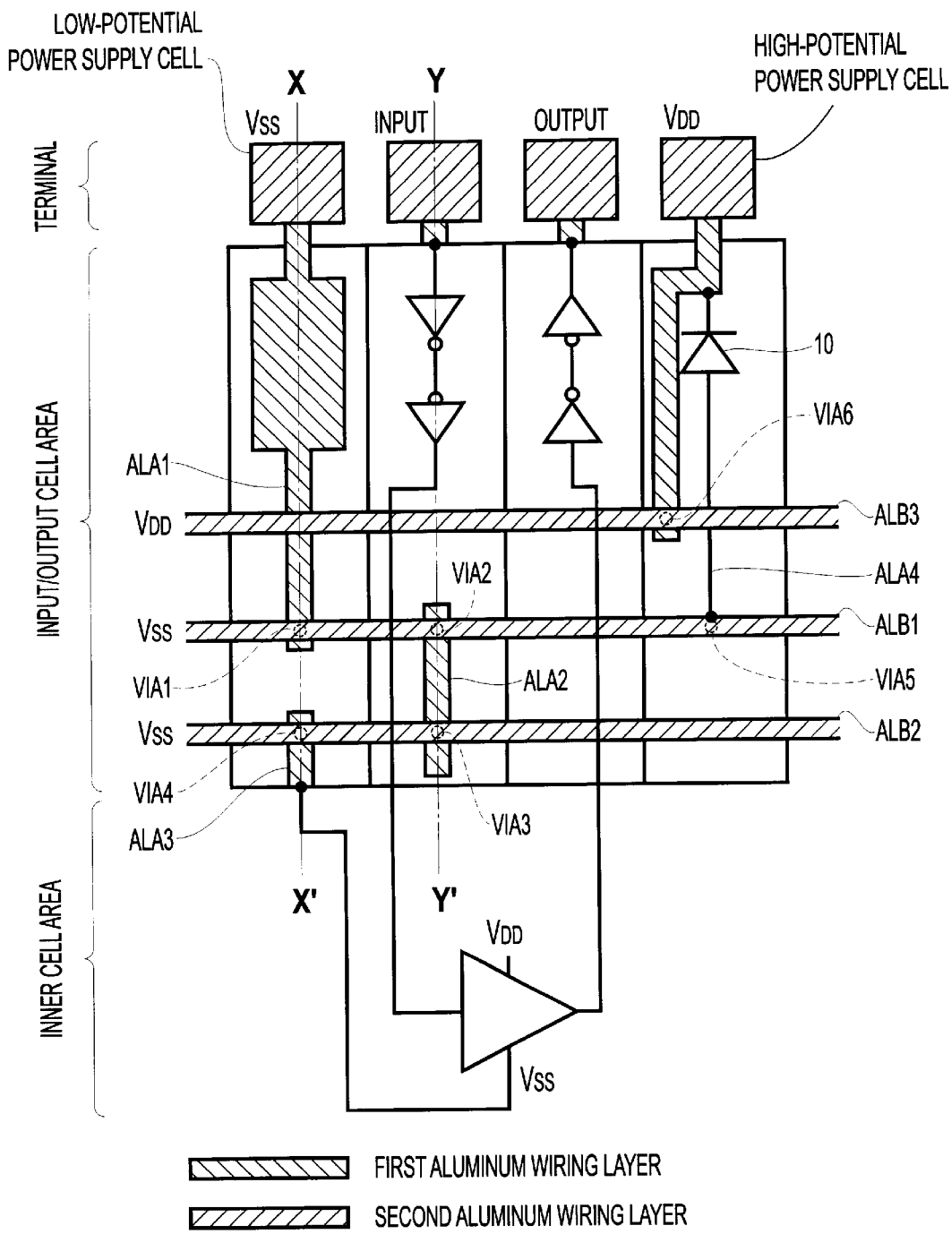
FIG. 1 is a plan view showing a part of a semiconductor integrated circuit according to the present invention.

Hereinbelow, embodiments of the present invention are described with reference to the drawings. The same reference numerals are assigned to the same components, and a description thereof is thus omitted.

Figure 2:
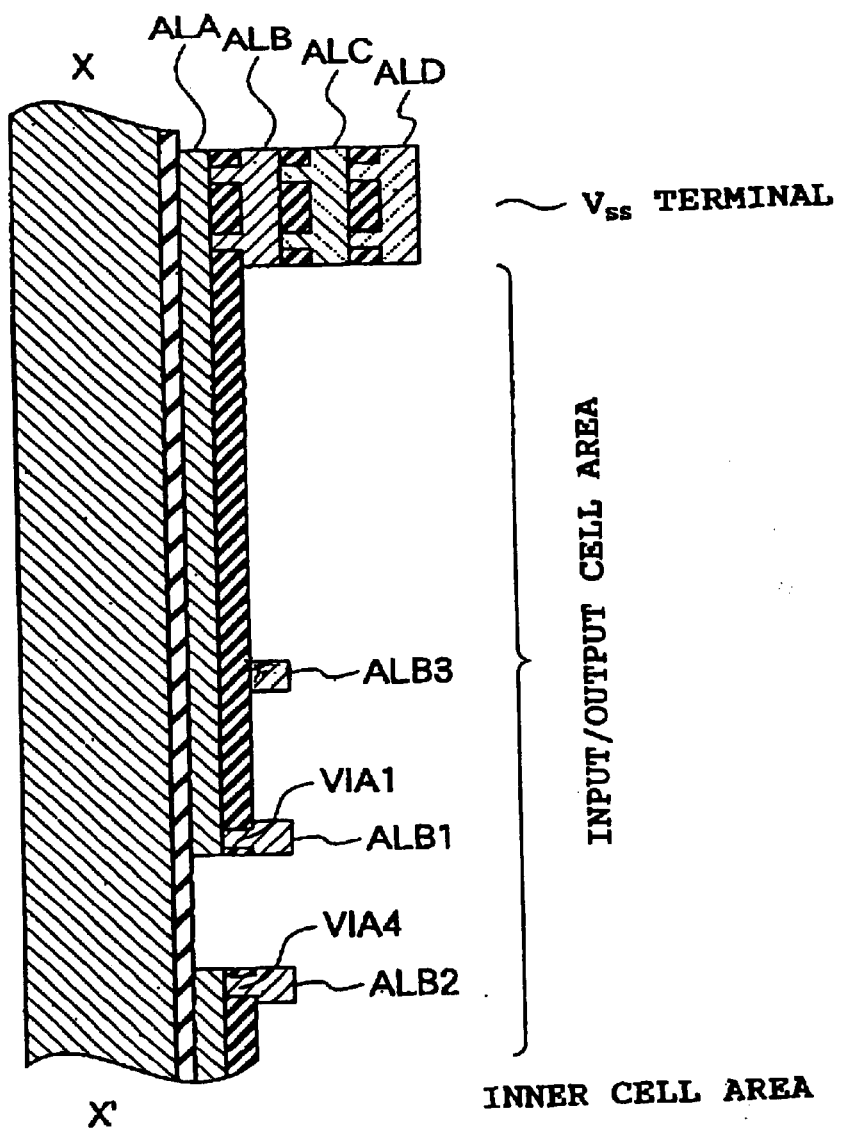
FIG. 2 is a cross-sectional view of the semiconductor integrated circuit taken along plane X–X' of FIG. 1.
Figure 3:
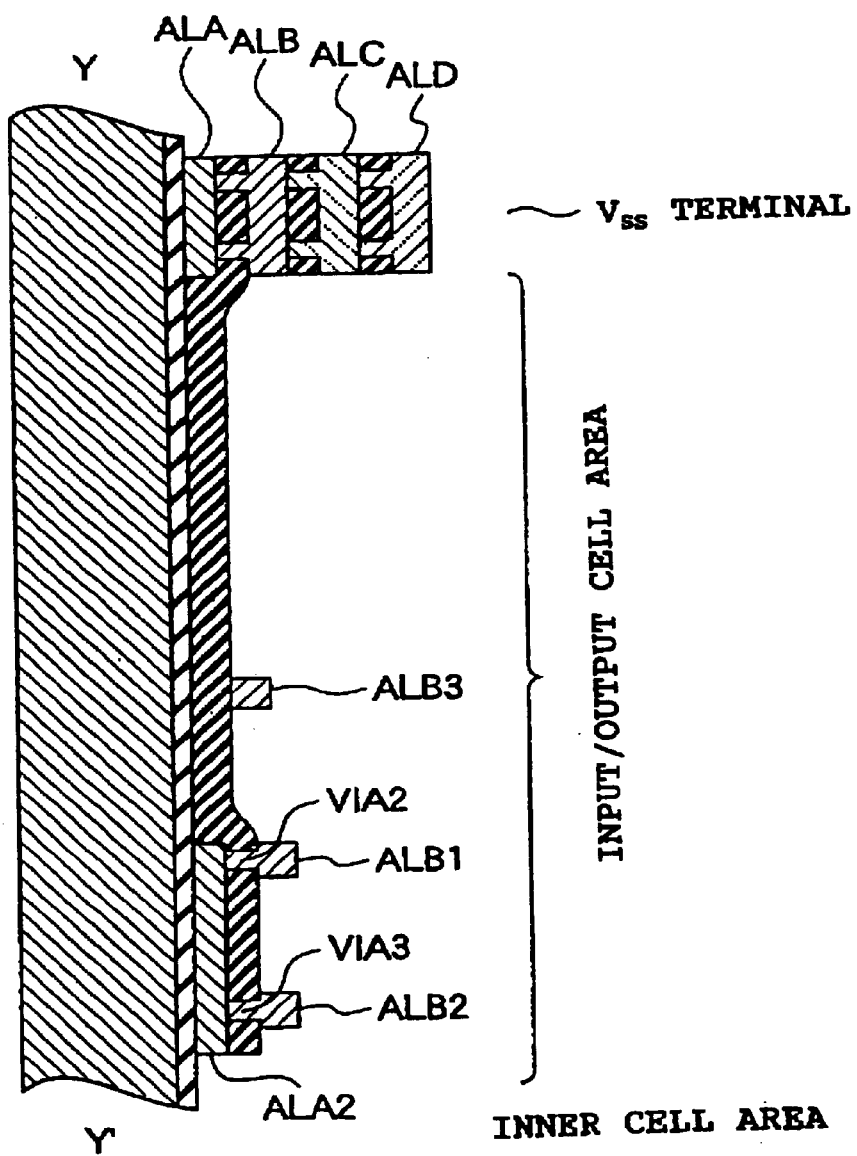
FIG. 3 is a cross-sectional view of the semiconductor integrated circuit taken along plane Y–Y' of FIG. 1.

FIG. 1 is a plan view showing a part of a semiconductor integrated circuit according to the present invention, FIG. 2 is a cross-sectional of the same taken along plane X–X' of FIG. 1, and FIG. 3 is a cross-sectional view of the same taken along plane Y–Y' of FIG. 1. In FIG. 1, an insulating interlayer is removed.

The semiconductor integrated circuit is formed as discussed below. Initially, a gate electrode is formed on a semiconductor substrate made of silicon, etc., via a gate insulating film. Then, impurity diffusion areas, which become source/drain, are formed on the semiconductor substrate at both sides of the gate electrode. The impurity diffusion areas and the gate electrode constitute a transistor. An insulating interlayer is further formed on the semiconductor substrate on which the transistor is formed, and the insulating interlayer defines a hole at a predetermined position. Subsequently, a wiring layer is formed on the insulating interlayer, on which wires are patterned by etching. The operations of insulating interlayer formation, wiring layer formation, and etching are repeated to form a desired circuit.

Symbols ALA, ALB, ALC, and ALD in FIGS. 1 to 3 indicate the first to fourth aluminum wiring layers, respectively. The X–X' cross-sectional view of FIG. 2 shows the cross-section of a $V_{SS}$ cell incorporating a $V_{SS}$ terminal to which a supply voltage $V_{SS}$ is applied, wherein the aluminum wire ALA1 is disconnected so as not to directly transmit the static electricity transmitted from the $V_{SS}$ terminal to an inner logic area. The Y–Y' cross-sectional view of FIG. 3 shows the cross-section of an input cell, wherein a path ALA2 for delivering the signal transmitted through a hole VIA1 and an aluminum wire ALB1 to an aluminum wire ALB2 is formed.

FIG. 1 shows the following two paths along which the static electricity applied to the $V_{SS}$ terminal, to which the low potential supply voltage $V_{SS}$ is applied, flows:

(1) $V_{SS}$ terminal—aluminum wire ALA1—hole VIA1—aluminum wire ALB1—hole VIA2—aluminum wire ALA2—hole VIA3—aluminum wire ALB2—hole VIA4—aluminum wire ALA3—inner cell (2) $V_{SS}$ terminal—aluminum wire ALA1—hole VIA1 in insulating interlayer—aluminum wire ALB1—hole VIA5—aluminum wire ALA4—protection diode 10

The paths (1) and (2) are common to the hole VIA2.

Since the static electricity applied to the $V_{SS}$ terminal passes through the ALB layer, the current which flows to the protection diode may increase compared to the case where it directly enters the inner cell via the ALA layer, which prevents the inner cell from being exposed to the static electricity.

Figure 4:
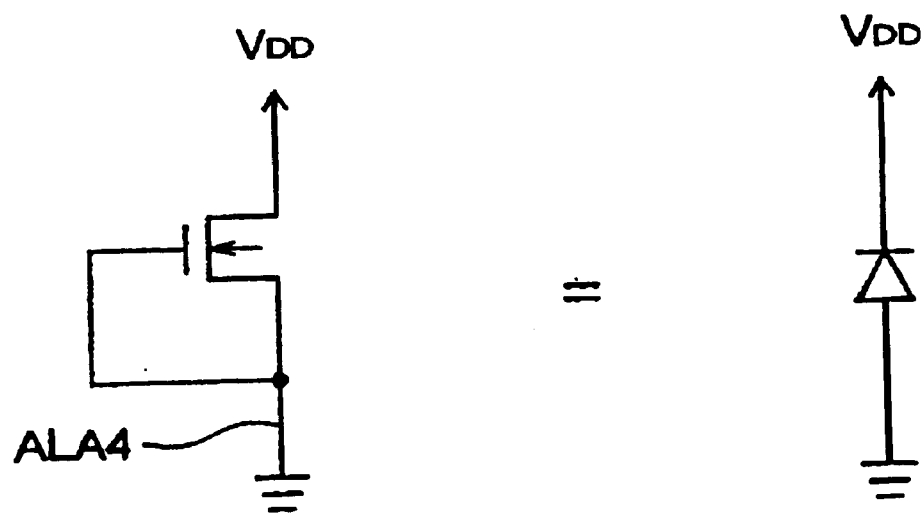
FIG. 4 is a view of the structure of a protection diode in the semiconductor integrated circuit shown in FIG. 1.
Figure 5:
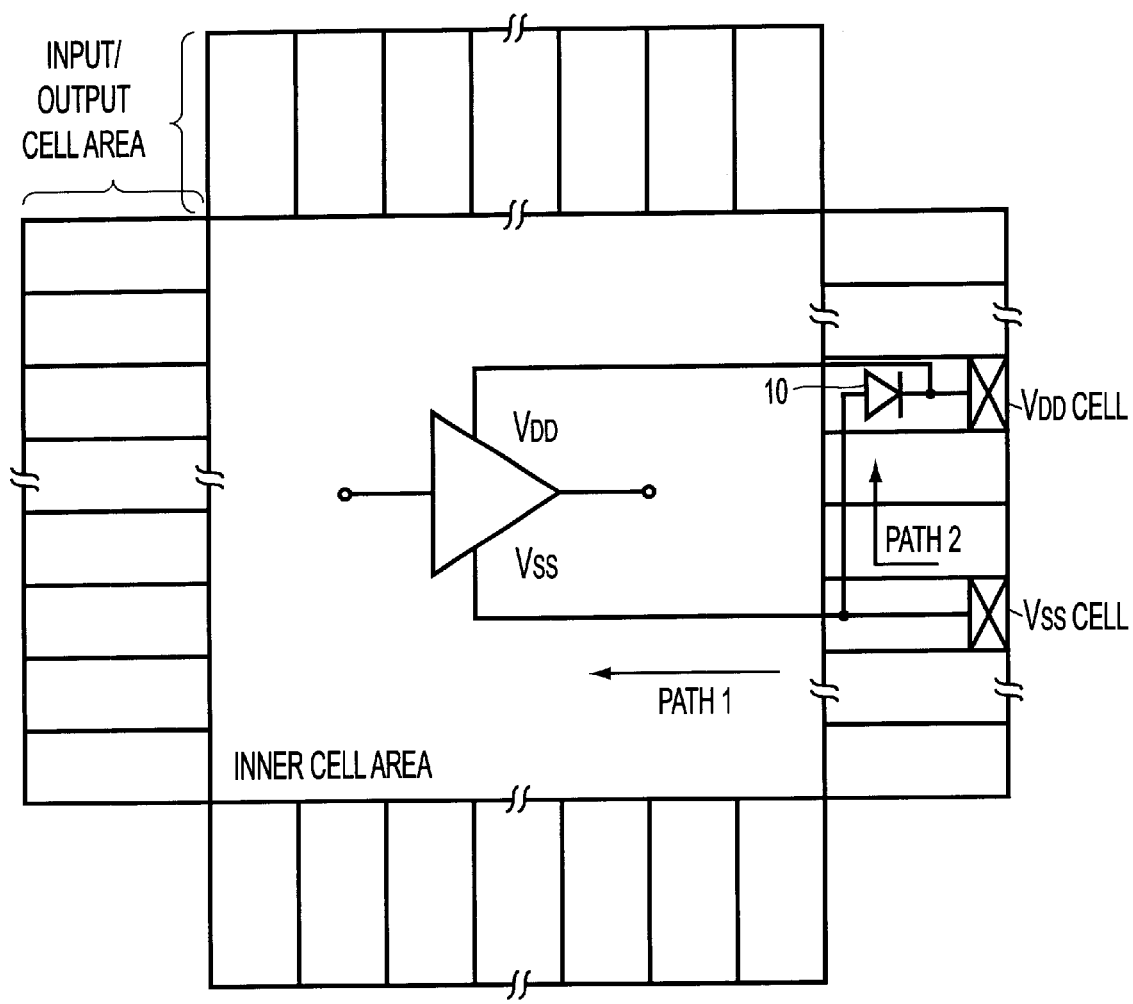
FIG. 5 is a schematic view of a conventional semiconductor integrated circuit.

Meanwhile, the protection diode 10 provided on the $V_{DD}$ cell is formed of an n-channel transistor, as shown in FIG. 4. When a normal supply voltage is applied, the protection diode 10 is reversely biased to prevent a current from flowing to the protection diode 10. Rather, a current flows along the path (1) and is input to the inner cell. On the other hand, when the positive static electricity is applied to the $V_{SS}$ terminal, the protection diode 10 is forwardly biased, so that a current flows to the protection diode 10. Therefore, the static electricity is discharged to the outside along the path (2) via the $V_{DD}$ terminal. Accordingly, by using such a protection circuit, a current can be selectively discharged to the outside only when static electricity having an excessive voltage is applied.

As described above, according to the present invention, the current from the $V_{SS}$ terminal is bypassed once to a higher wiring layer, so that even if static electricity having an excessive voltage is applied to the $V_{SS}$ cell, the static electricity can be discharged to the outside via the electrostatic protection circuit before the static electricity is transmitted to the inner cell, which prevents electrostatic destruction of the inner cell.

What is claimed is:

1. A semiconductor integrated circuit, comprising:
   a plurality of input/output cells including a high-potential power supply cell incorporating a high potential power supply terminal, and a low-potential power supply cell incorporating a low-potential power supply terminal;
   a lower wiring layer having a plurality of wires connected to the high-potential power supply terminal and the low-potential power supply terminal;
   an insulating interlayer defining at least one hole;
   at least one higher wiring layer formed over the lower wiring layer across the insulating interlayer, and electrically connected to the lower wiring layer via the at least one hole defined by the insulating interlayer;
   a protection diode having a cathode and an anode electrically connected to the high-potential power supply terminal and the low-potential power supply terminal, respectively, via at least the lower wiring layer; and
   an inner cell electrically connected to the low-potential power supply terminal via the lower wiring layer and the higher wiring layer,
   wherein current flows to the protection diode via a path comprising, in sequence, low-potential power supply terminal—a first portion of the lower wiring layer located on the low-potential power supply cell—a first portion of the higher wiring layer via a first hole in the insulating interlayer—a second portion of the lower wiring layer via a second hole in the insulating interlayer—protection diode.

2. The semiconductor integrated circuit according to claim 1, said inner cell being electrically connected to the low-potential power supply terminal via a portion of the lower wiring layer located on the low-potential power supply cell, the higher wiring layer, and a portion of the lower wiring layer located on an input/output cell other than the low-potential power supply cell.

3. The semiconductor integrated circuit according to claim 1, wherein when a normal voltage is applied to the low-potential power supply terminal, the protection diode is reversely biased and current flows to the inner cell, and wherein when positive static electricity is applied to the low-potential power supply terminal, the protection diode is forwardly biased and current flows to the protection diode to be discharged to outside via the high-potential power supply terminal.

4. A semiconductor integrated circuit, comprising:
   a plurality of input/output cells including a high-potential power supply cell incorporating a high potential power supply terminal, and a low-potential power supply cell incorporating a low-potential power supply terminal;
   a lower wiring layer having a plurality of wires connected to the high-potential power supply terminal and the low-potential power supply terminal;
   an insulating interlayer defining at least one hole;
   at least one higher wiring layer formed over the lower wiring layer across the insulating interlayer, and electrically connected to the lower wiring layer via the at least one hole defined by the insulating interlayer;
   a protection diode having a cathode and an anode electrically connected to the high-potential power supply terminal and the low-potential power supply terminal, respectively, via at least the lower wiring layer; and
   an inner cell electrically connected to the low-potential power supply terminal via the lower wiring layer and the higher wiring layer,
   wherein current flows to the inner cell via a path comprising, in sequence, the low-potential power supply terminal—a first portion of the lower wiring layer located on the low-potential power supply cell—a first portion of the higher wiring layer via a first hole in the insulating interlayer—a second portion of the lower wiring layer located on an input/output cell other than the low-potential power supply cell via a second hole in the insulating interlayer—a second portion of the higher wiring layer via a third hole in the insulating interlayer—a third portion of the lower wiring layer via a fourth hole in the insulating interlayer—inner cell.

* * * * *